(12) United States Patent
Noquil et al.

(10) Patent No.: US 7,663,211 B2
(45) Date of Patent: Feb. 16, 2010

(54) DUAL SIDE COOLING INTEGRATED POWER DEVICE PACKAGE AND MODULE WITH A CLIP ATTACHED TO A LEADFRAME IN THE PACKAGE AND THE MODULE AND METHODS OF MANUFACTURE

(75) Inventors: Jonathan A. Noquil, Bislig (PH); Ruben Madrid, Lapu-Lapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/829,793

(22) Filed: Jul. 27, 2007

(65) Prior Publication Data
US 2008/0023807 A1 Jan. 31, 2008

Related U.S. Application Data

(63) Continuation-in-part of application No. 11/740,475, filed on Apr. 26, 2007.

(60) Provisional application No. 60/802,181, filed on May 19, 2006, provisional application No. 60/916,994, filed on May 9, 2007.

(51) Int. Cl.
*H01L 23/495* (2006.01)
*H01L 21/60* (2006.01)
*H01L 23/02* (2006.01)
*H01L 23/48* (2006.01)

(52) U.S. Cl. ............... 257/675; 257/E23.125; 257/E23.031; 257/E23.034; 257/E23.044; 257/E23.046; 257/E23.052; 257/E23.101; 257/E23.124; 257/E21.506; 257/778; 257/685; 257/723; 257/712; 257/713; 257/717; 257/720; 257/737; 257/738; 438/123; 438/108

(58) Field of Classification Search ........... 257/675, 257/E23.125, 738, 737, 734, 778, 723, 685, 257/720, 717, 712, 713, E23.124, E23.101, 257/E23.052, E23.046, E23.044, E23.034, 257/E23.031, E21.506; 438/123, 108
See application file for complete search history.

(56) References Cited

U.S. PATENT DOCUMENTS 4,961,106 A 10/1990 Butt et al.
(Continued)

FOREIGN PATENT DOCUMENTS

WO WO 2006/012571 2/2006
WO WO 2006/044248 4/2006

OTHER PUBLICATIONS

Ashkenasy et al., "Recognizing a Single Base in an Individual DNA Strand: A Step Toward DNA Sequencing in Nanopores", Angewandte Chemie International Edition, vol. 44, pp. 1401-1404, 2005.

(Continued)

*Primary Examiner*—Alexander O Williams
(74) *Attorney, Agent, or Firm*—Hiscock & Barclay, LLP

(57) ABSTRACT

An integrated power device module having a leadframe structure with first and second spaced pads and one or more common source-drain leads located between said first and second pads, first and second transistors flip chip attached respectively to said first and second pads, wherein the source of said second transistor is electrically connected to said one or more common source-drain leads, and a first clip attached to the drain of said first transistor and electrically connected to said one or more common source-drain leads. In another embodiment a partially encapsulated power quad flat no-lead package having an exposed top thermal drain clip which is substantially perpendicular to said with a folded stud exposed top thermal drain clip, and an exposed thermal source pad.

20 Claims, 16 Drawing Sheets

U.S. PATENT DOCUMENTS

| | | | |
|---|---|---|---|
| 5,796,159 | A | 8/1998 | Kierse |
| 6,849,942 | B2 | 2/2005 | Lin et al. |
| 6,917,098 | B1 | 7/2005 | Yamunan |
| 2005/0280163 | A1 | 12/2005 | Schaffer et al. |
| 2005/0285238 | A1 | 12/2005 | Joshi et al. |
| 2006/0044772 | A1* | 3/2006 | Miura ................. 361/767 |
| 2006/0151861 | A1 | 7/2006 | Noquil et al. |
| 2006/0186551 | A1 | 8/2006 | Lange et al. |
| 2007/0114352 | A1 | 5/2007 | Cruz et al. |
| 2007/0132073 | A1* | 6/2007 | Tiong et al. ............ 257/666 |

OTHER PUBLICATIONS

Astier et al., "Toward Single Molecule DNA Sequencing: Direct Identification of Ribonucleoside and Deoxyribonucleoside 5'-Monophosphates by Using an Engineered Protein Nanopore Equipped with a Molecular Adapter", Journal of American Chemical Society, vol. 128, pp. 1705-1710, 2006.

Balets et al., Dynamics of DNA Molecules in a Membrane Channel Probed by Active Control Techniques, Biophysical Journal, vol. 84, pp. 2366-2372, Apr. 2003.

Henrickson et al., "Driven DNA Transport into an Asymmetric Nanometer-Scale Pore", Physical Review Letters, vol. 85, No. 14, pp. 3057-3060, Oct. 2, 2000.

Kasianowicz et al., "Characterization of Individual Polynucleotide Molecules Using a Membrane Channel", Proc. Natl. Acad. Sci., vol. 93, pp. 13770-13773, Nov. 1996.

Lagerqvist et al., "Fast DNA Sequencing Via Transverse Electronic Transport", Nano Lett., vol. 6, No. 4, pp. 1-5, Apr. 17, 2006.

http://www.ornl.gov/sci/techresources/Human_Genome/home.shtml.

International Search Report from corresponding PCT application (PCT/US07/070611 filed Jul. 21, 2008) as published on Feb. 9, 2009 by the ISA/KR (total 2 pages).

* cited by examiner

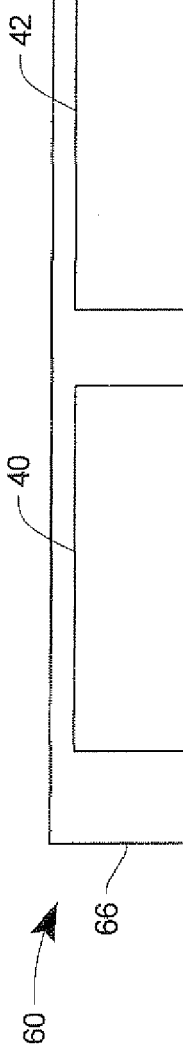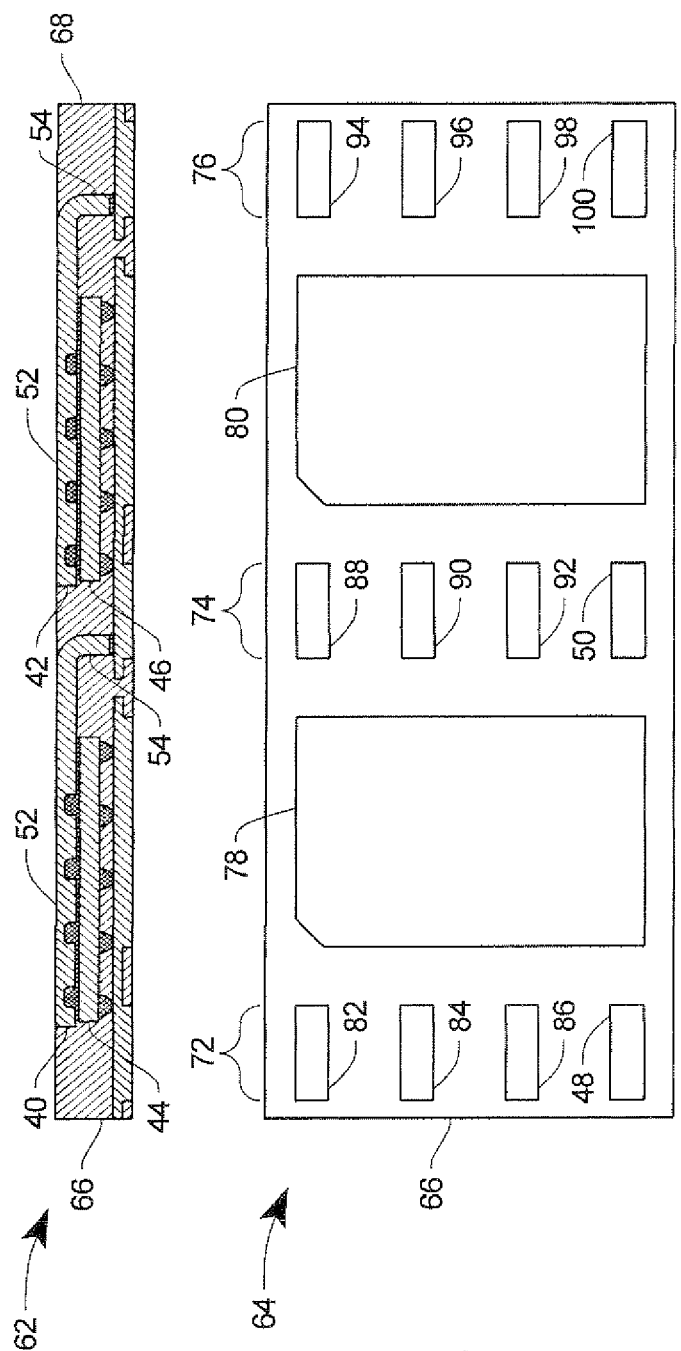
FIG. 3A
FIG. 3B
FIG. 3C

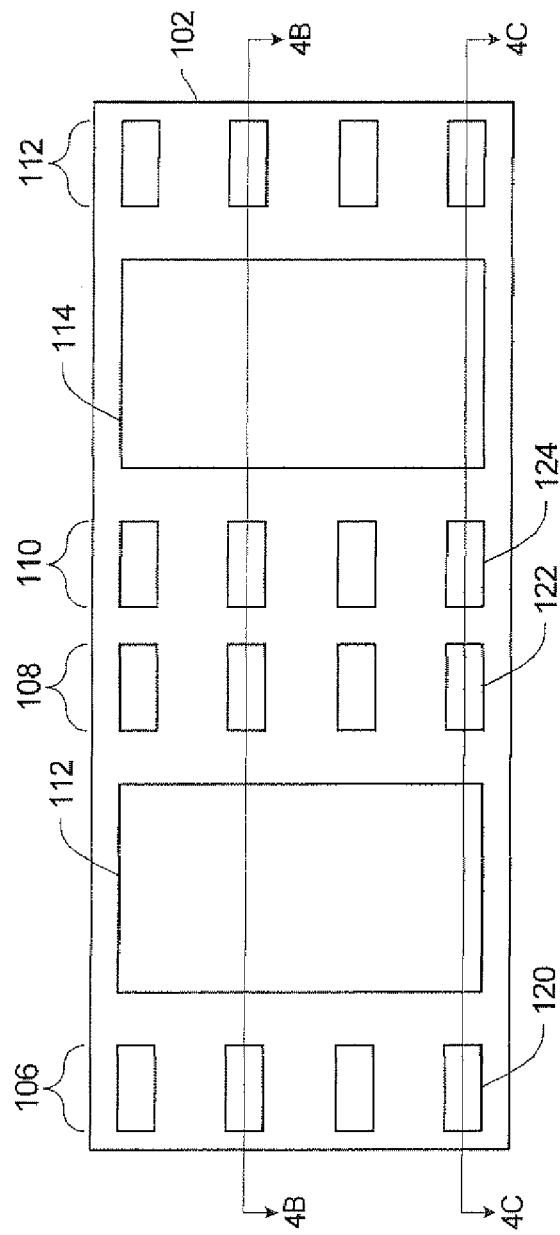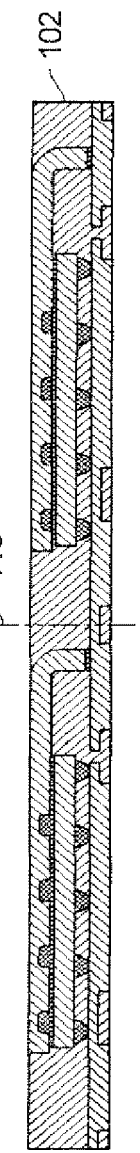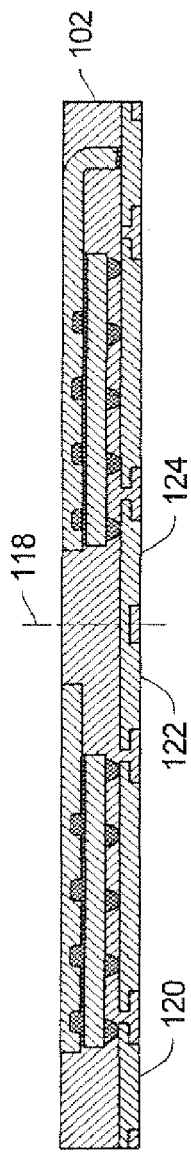
FIG. 4A
FIG. 4B
FIG. 4C

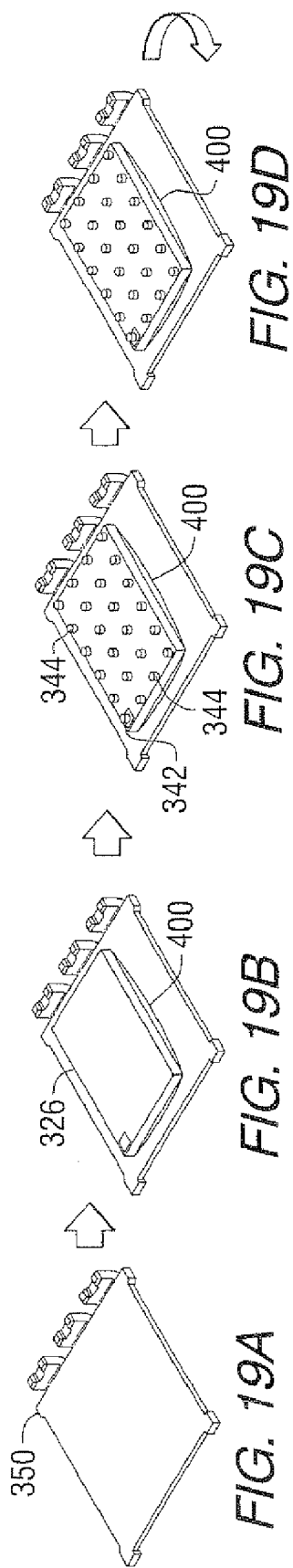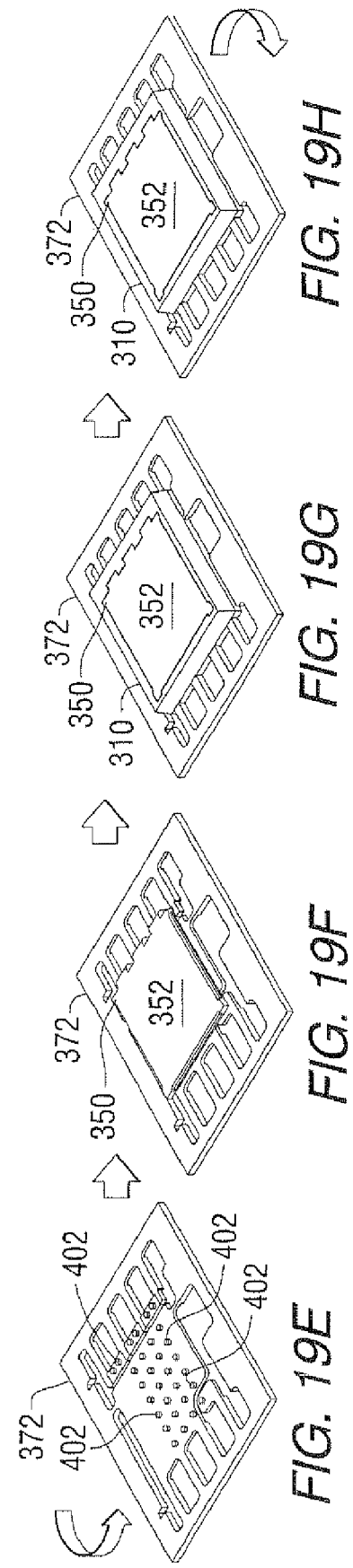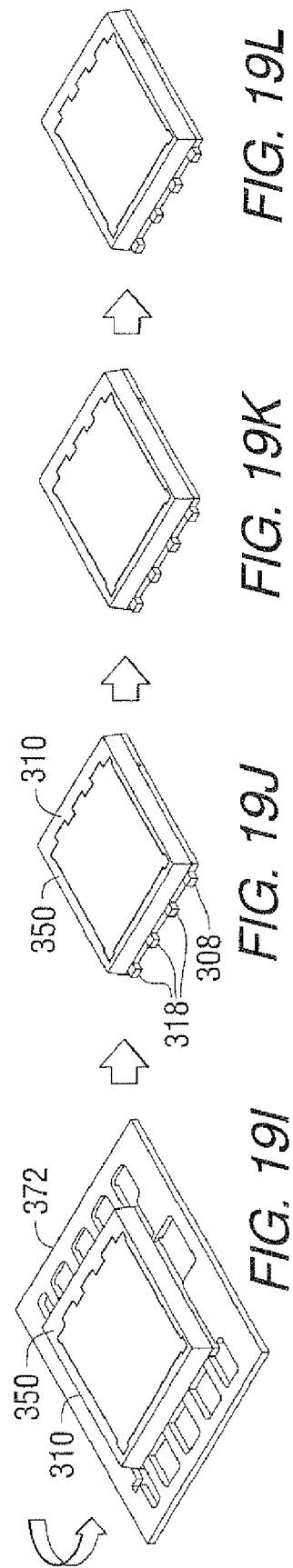

DUAL SIDE COOLING INTEGRATED POWER DEVICE PACKAGE AND MODULE WITH A CLIP ATTACHED TO A LEADFRAME IN THE PACKAGE AND THE MODULE AND METHODS OF MANUFACTURE

CROSS-REFERENCE TO RELATED APPLICATIONS

This application is a continuation-in-part of U.S. patent application Ser. No. 11/740,475 which claims the benefit of U.S. Provisional Patent Application Ser. No. 60/802,181, filed on May 19, 2006, which application is hereby incorporated by reference. This application also claims the benefit of U.S. Provisional Application Ser. No. 60/916,994, filed on May 9, 2007, which application is hereby incorporated by reference. Reference is also made to a related application Ser. No. 11/625,100, filed Jan. 19, 2007 entitled "Flip Chip MLP with Folded Heat Sink" which is also incorporated herein by reference.

FIELD OF THE INVENTION

This invention relates in general to packaging of semiconductor devices and more particularly to a dual side cooling integrated power device module and methods of making same.

BACKGROUND OF THE INVENTION

Small packages for semiconductors with short leads are desirable for forming electronic circuits which are compact. However, such small packages provide problems in terms of dissipating heat from packaged power devices used in the electronic circuits. In many cases the heat dissipating capacity of the leads only is not sufficient to provide reliable operation of the power device. In the past heat sinks have been attached to such devices to help dissipate the heat.

Another factor in forming compact circuits is the amount of space required for wire bonds in conventional packages. Thus it would be desirable to provide a package for a power device which efficiently dissipates heat while minimizing the amount of area on a circuit board for the package.

The arrangement of two power devices which have a common high current input or output terminal are found in such circuits as synchronous buck converters. Synchronous buck converters are commonly used as power supplies for cell phones, portable computers, digital cameras, routers, and other portable electronic devices. Synchronous buck converters shift DC voltage levels in order to provide power to programmable grid array integrated circuits, microprocessors, digital signal processing integrated circuits, and other circuits, while stabilizing battery outputs, filtering noise, and reducing ripple. These devices are also used to provide high current multiphase power in a wide range of data communications, telecommunications, point-of-load and computing applications.

FIG. 1 shows a block diagram of a typical synchronous buck converter 10. The converter has a high side FET 12 and a low side FET 14 which are driven by a pulse width modulation (PWM) IC 16. The Q1 and Q2 devices 12, 14 can be configured as discrete devices which require optimal layout to reduce parasitic resistances 18 and inductances 20 caused by the connection of the source of high side FET 12 to the drain of the low side FET 14 on a printed circuit board (PCB).

US Patent Application Publication No. 2005/0285238 A1, published Dec. 29, 2005, inventors Joshi et al., discloses an integrated transistor module including a leadframe structure that defines a low side land and a high side land. A low side transistor is mounted on the low side land with its drain electrically connected to the low side land. A high-side transistor is mounted on the high-side land with its source electrically connected to the high side land. A stepped portion of the leadframe structure electrically connects the low and high side lands and thus also the drain of the low-side transistor with the source of the high-side transistor.

Although the integrated transistor module of the latter published patent publication is useful for the applications for which it was intended, the module footprint is not a common one in the industry.

There is thus a need for an improved integrated power device module that can be used in circuits such as synchronous buck converter circuits that offer a solution to these problems.

SUMMARY OF THE INVENTION

According to the present invention there is provided a solution to these problems.

According to a feature of the present invention, there is provided an integrated power device module comprising:

a leadframe structure having first and second spaced pads and one or more common source-drain leads located between said first and second pads;

first and second transistors flip chip attached respectively to said first and second pads, wherein the source of said second transistor is electrically connected to said one or more common source-drain leads; and a first clip attached to the drain of said first transistor and electrically connected to said one or more common source-drain leads.

According to another feature of the present invention there is provided an integrated power device module comprising:

a leadframe structure having first and second spaced pads, one or more common source-drain leads located between said first and second pads, and one or more drain leads located on the outside of said second pad;

first and second transistors flip chip attached respectively to said first and second pads, wherein the source of said second transistor is electrically connected to said one or more common source-drain leads;

a first clip attached to the drain of said first transistor and electrically connected to said one or more common source-drain leads;

a second clip attached to the drain of said second transistor and electrically connected to said one or more drain leads located on the outside of said second pad; and molding material encapsulating said leadframe structure, said transistors, and said clips to form said module.

According to a further feature of the present invention there is provided a method of making an integrated power device module comprising:

providing a leadframe structure having first and second spaced pads, one or more common source-drain leads located between said pads and one or more drain leads located on the outside of said second pad;

flip chip attaching first and second transistors respectively to said first and second pads, wherein the source of said second transistor is electrically connected to said one or more common source-drain leads;

attaching a first clip to the drain of said first transistor and electrically connecting said first clip to said one or more common source-drain leads;

attaching a second clip to the drain of said second transistor and electrically connecting said second clip to said one or more drain leads located on the outside of said second pad; and encapsulating said leadframe structure, said transistors, and said clips with molding material to form said module.

According to a still further feature of the present invention there is provided a partially encapsulated semiconductor package having an exposed top thermal clip with a plurality of folded bent portions which are substantially perpendicular to the exposed top portion of the thermal clip, and an exposed thermal leadframe structure pad.

According to yet another feature of the present invention there is provided a method of making a partially encapsulated semiconductor package by providing a coplanar leadframe structure having three separate segments, a control segment, a first high current segment and a second high current segment, attaching a semiconductor device to two of the control segment and the first current segment attaching a clip to a side of the semiconductor device opposite the leadframe structure which has a plurality of bent portions, the plurality of bent portions being attached to the second current segment, and partially encapsulating the leadframe structure, the semiconductor device, and the clip with molding material to form the package.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 3A, 3B, and 3C are respective top plan, cross section side, and bottom plan views of the structure shown in FIG. 2C after the structure has been partially encased in encapsulation material;

FIG. 4A is a bottom plan view of a dual side cooling integrated power device module according to another embodiment of the present invention;

FIG. 4B is a cross section side view of one embodiment of the module shown in FIG. 4A;

FIG. 4C is a cross section side view of another embodiment of the module shown in FIG. 4A;

FIGS. 19A, 19B, 19C, 19D, 19E, 19F, 19G, 19H, 19I, 19J, 19K, and 19L are isometric views of the power semiconductor package shown in FIG. 10 at various stages in the assemble of the package 300.

Figure 1:
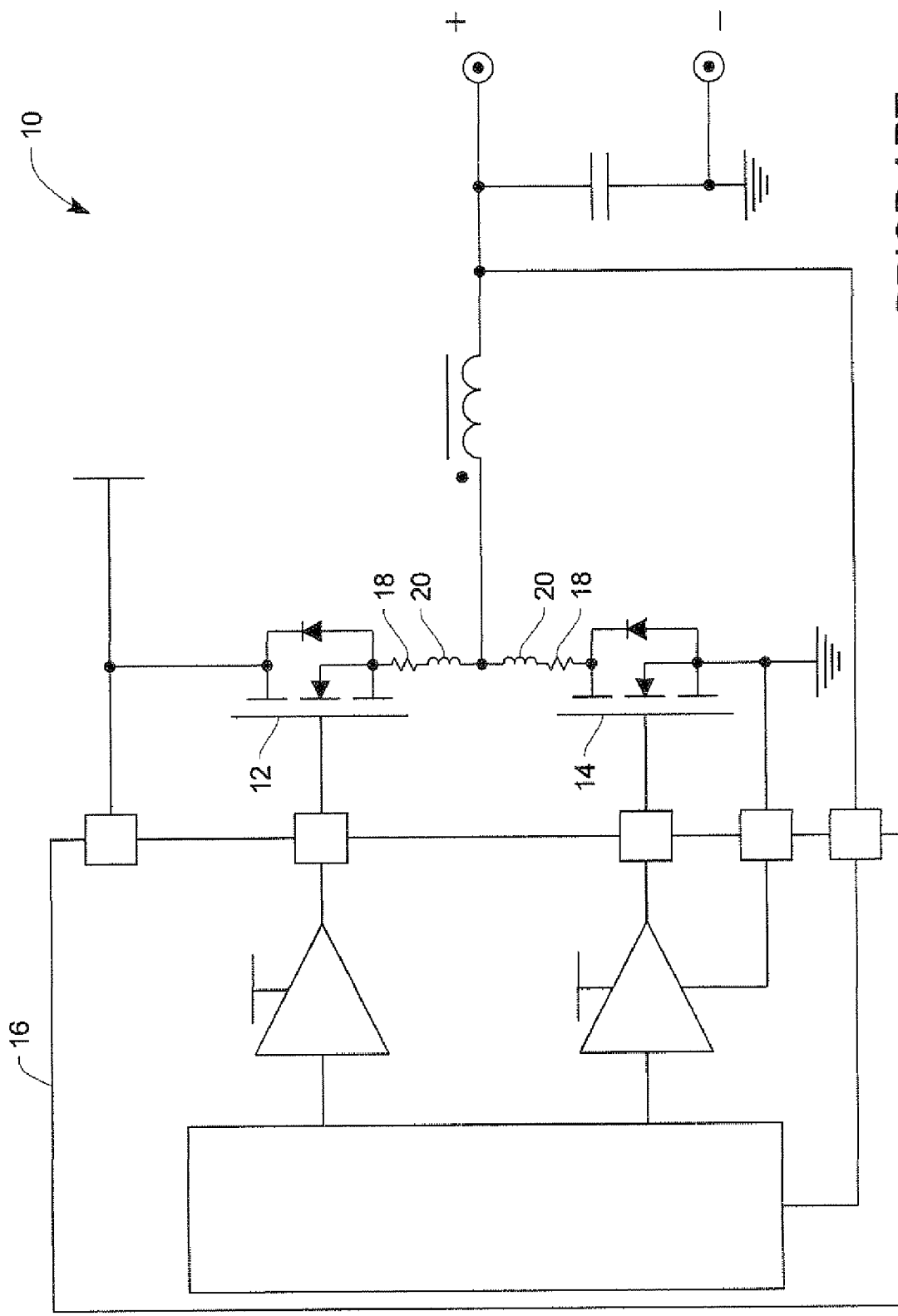
FIG. 1 is a schematic diagram of a typical synchronous buck converter circuit.

It will be appreciated that for purposes of clarity and where deemed appropriate, reference numerals have been repeated in the figures to indicate corresponding features. Also, the relative size of various objects in the drawings has in some cases been distorted to more clearly show the invention.

DESCRIPTION OF THE INVENTION

Embodiments of the invention are directed to semiconductor die packages and methods for making semiconductor die packages. A semiconductor die package according to an embodiment of the invention includes a substrate, and a semiconductor die mounted on the substrate. The semiconductor die may at attached to the substrate using an adhesive or any other suitable attachment material. In the semiconductor die package, the bottom surface and/or the top surface of the semiconductor die may be electrically coupled to conductive regions of the substrate. An encapsulating material may encapsulate the semiconductor die. As will be explained in further detail below, the substrates according to embodiments of the invention can have different configurations in different embodiments.

The substrate may have any suitable configuration. However, in preferred embodiments of the invention, the substrate includes a leadframe structure and a molding material. Typically, at least one surface of the leadframe structure is substantially coplanar with an exterior surface of the molding material. In some embodiments, both opposing major surfaces of the leadframe structure are substantially coplanar with opposing exterior surfaces of the molding material in the substrate.

The term "leadframe structure" can refer to a structure that is derived from a leadframe. Leadframe structures can be formed by, for example, stamping processes which are known in the art. An exemplary leadframe structure can also be formed by etching a continuous conductive sheet to form a predetermined pattern. Thus, in embodiments of the invention, a leadframe structure in a semiconductor die package may be a continuous metallic structure or a discontinuous metallic structure.

A leadframe structure according to an embodiment of the invention may originally be one of many leadframe structures in an array of leadframe structures that are connected together by tie-bars. During the process of making a semiconductor die package, the leadframe structure array may be cut to separate individual leadframe structures from each other. As a result of this cutting, portions of a leadframe structure (such as a source lead and a gate lead) in a final semiconductor die package may be electrically and mechanically uncoupled from each other. In other embodiments, an array of leadframe structures is not used when manufacturing semiconductor die packages according to embodiments of the invention.

A leadframe structure according to an embodiment of the invention many comprise any suitable material, may have any suitable form, and may have any suitable thickness. Exemplary leadframe structure materials include metals such as copper, aluminum, gold, etc., and alloys thereof. The leadframe structures may also include plated layers such as plated layers of gold, chromium, silver, palladium, nickel, etc.

A leadframe structure according to an embodiment of the invention may also have any suitable configuration. For example, the leadframe structure may also have any suitable thickness including a thickness less than about 1 mm (e.g., less than about 0.5 mm). In addition, the leadframe structure may have a die attach region which may form a die attach pad (DAP). Leads may extend laterally away from the die attach region. They may also have surfaces that are coplanar with the surface forming the die attach region.

The molding material that is used in the substrate may comprise any suitable material. Suitable molding materials include biphenyl based materials, and multi-functional cross-linked epoxy resin composite materials. Suitable molding materials are deposited in liquid or semi-solid form on a leadframe structure, and are thereafter cured to harden them.

The semiconductor die that is mounted on the substrate may include any suitable semiconductor device. Suitable devices may include vertical devices. Vertical devices have at least an input at one side of the die and an output at the other side of the die so that current can flow vertically through the die. Exemplary semiconductor devices are also described in U.S. patent application Ser. No. 11/026,276, filed on Dec. 29, 2004, which is herein incorporated by reference in its entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

An encapsulating material may be used to encapsulate the semiconductor die. The encapsulating material may comprise the same or different type of material as the previously described molding material. In some embodiments, the encapsulating material covers or at least partially covers the substrate, and one or more semiconductor dice on the substrate. The encapsulating material may be used to protect the one or more semiconductor dice from potential damage due to exposure to the surrounding environment.

Any suitable process may be used to encapsulate the semiconductor die(s) and/or the substrate that supports the semiconductor dice(s). For example, a semiconductor die and substrate may be placed in a molding die, and an encapsulating material may be formed around at least part of the semiconductor die and/or the substrate. Specific molding conditions are known to those of ordinary skill in the art.

Figure 2A:
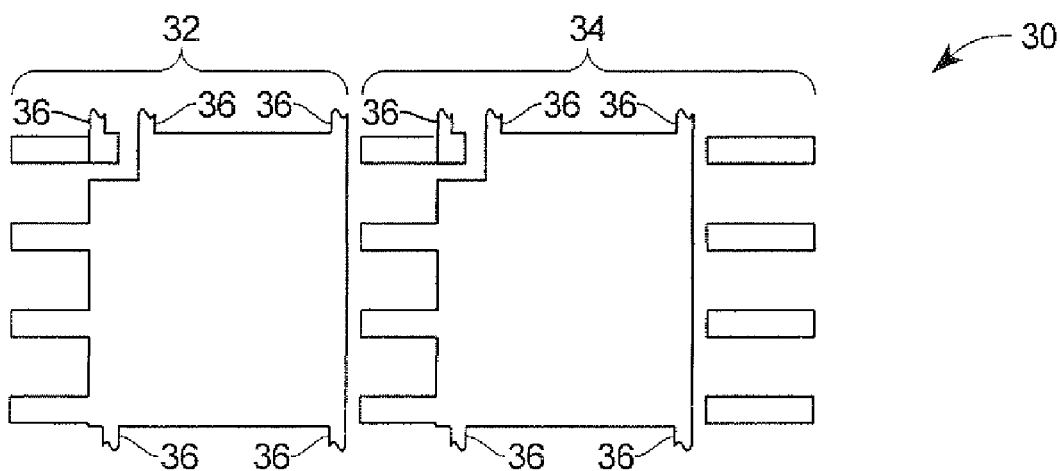
FIG. 2A is a plan view of two leadframe structures of the type used to form a dual side cooling integrated power device module according to one embodiment of the present invention.
Figure 2B:
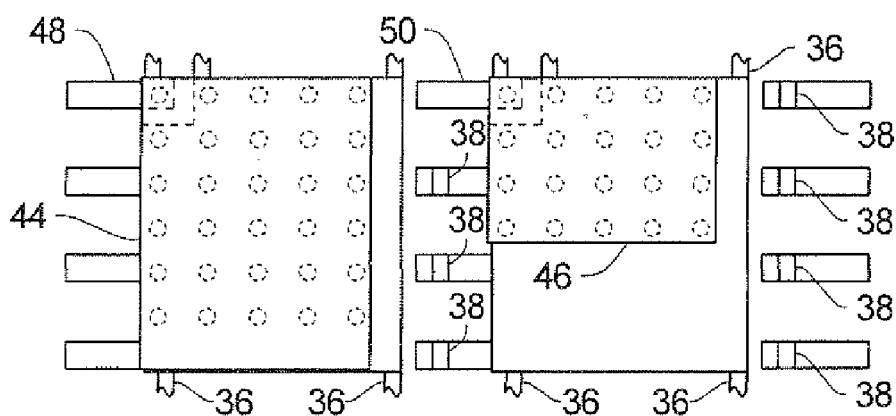
FIG. 2B is a plan view of the leadframe structures shown in FIG. 2A with transistor dies bonded to the leadframe structures according to one embodiment of the present invention.
Figure 2C:
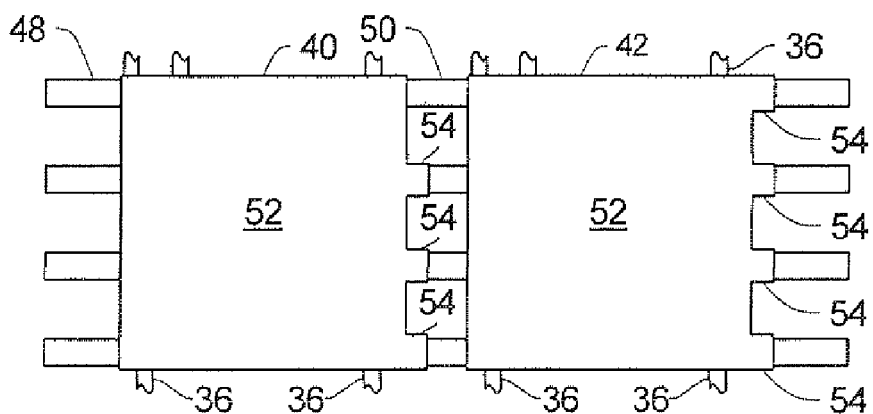
FIG. 2C is a plan view of the leadframe structures of FIG. 2A with two cooling chips attached to leadframe structures shown in FIG. 2A and the transistor dies shown in FIG. 2B according to one embodiment of the present invention.

FIG. 2A is a plan view 30 of two leadframe structures 32 and 34 of the type used to form a dual side cooling integrated power device module according to one embodiment of the present invention. The leadframe structures 32, 34 have connecting bars 36 which are shown in FIGS. 2A-2C and removed in a singulation process after the encapsulation operation, are not shown in the other figures to avoid cluttering the figures. The connecting bars allow the leadframe structures 32, 34 to be placed in gang and fabricated in one reel. As shown in FIG. 2B solder paste 38 is applied to the leads of the leadframe structures 32, 34 which will be soldered to two clips 40 and 42 and two power devices 44 and 46 are flipped over and placed onto the leadframe structures 32 and 34, respectively. The power devices 44, 46 are coated with solder during the manufacture of the chips. In FIG. 2C the two clips 40, 42 are placed over the leadframe structures 32, 34 and the power devices 44, 46, respectively, and the module is heated to bond the power devices 44, 46 to the leadframe structures 32, 34, and to reflow the solder paste on the appropriate leads of the leadframe structures 32, 34 and on the back side of the power devices 44, 46, respectively. For simplicity of discussion the power devices 44, 46 will hereinafter be referred to as MOSFETs 44, 46 although the present invention is not limited to MOSFETs or MOSFETs alone. For example, the diodes across the sources and drains of the FETs 12 and 14 would possibly be part of the power devices 44 and 46.

As can be seen in FIG. 2B leads 48 and 50 are connected to the respective gates of the MOSFETs 44, 46, respectively, and these leads are electrically isolated from the rest of the respective leadframe structures 32, 34 after the singulation process. The portions of the leadframe structures 32, 34 not connected to the leads 48 or 50 are connected to the sources of the MOSFETs 44, 46, respectively. The drains of the MOSFETs 40, 46 are soldered to clips 40, 42, respectively.

The clips 40, 42 have planar members 52 and a plurality of downwardly extending leads 54 which are soldered to the leads with solder paste 38 during the reflow soldering process. As a result the source of the MOSFET 44 is connected to the drain of the MOSFET 46 by the clip 40.

FIGS. 3A, 3B, and 3C are respective top plan 60, cross section side 62, and bottom plan 64 views of an integrated power device module 66 which is the structure shown in FIG. 2C partially encapsulated with encapsulating material 68 such as epoxy. The cross section view of FIG. 3B is along the line 3B-3B in FIG. 3A. The planar members 52 are exposed at the top of the module 66 in FIG. 3A. As shown in FIG. 3C the bottom of the module 66 has a column of lead lands 72, 74, and 76 along with exposed source pads 78 and 80 which are part of the leadframe structures 32, 34. Leads 82, 84, and 86 are connected to the source of the MOSFET 44 as is the source pad 78. Leads 88, 90, and 92 are the common connection of the drain of the MOSFET 44 and the source of the MOSFET 46, and leads 94, 96, 98, and 100 are connected to the emitter of the MOSFET 46 by the clip 42.

The module 66 is appropriate for use in the synchronous buck converter 10 of FIG. 1 by replacing the two discrete FETs 12 and 14 with module 66 with the FET 12 replaced by the MOSFET 44, and the FET 14 replaced by the MOSFET 46. By using the module 66, with the clip 40 providing the electrical connection of the drain of the low side MOSFET 44 to the source of the high side MOSFET 46, the two MOSFETs 44, 46 are physically closer together and parasitic resistances 18 and inductances 20 are substantially reduced. Moreover, cooling of the power FETs is improved by the inherent heat sinking characteristics of the clips 40, 42, the top surfaces 56 of which are not encapsulated. The cooling is further improved by dual side cooling since the sources of the two devices are exposed via the leadframe structure to which they are attached. The method of forming the module 66 also results in improved solder joint reliability since a single solder reflow is required rather than multiple solder reflows.

FIGS. 4A, 4B, and 4C are bottom plan and side cross section views of a dual side cooling integrated power device module 102 according to another embodiment of the present invention. The bottom plan view of FIG. 4A shows four columns of lead lands 106, 108, 110, and 112 along with the source pads 114 and 116. When the module 102 is manufactured, the leads in columns 108 and 110 are connected together as shown in FIGS. 4B and 4C, but are designed such that the module 102 can be split into two separate single power device modules by severing the module 102 along the line 118 shown in FIGS. 4B and 4C separating the leads in column 108 from the leads in column 110. The cross section views in FIGS. 4B and 4C are taken along the lines 4B-4B and 4C-4C, respectively, in FIG. 4A. In FIG. 4C the lead lands 120, 122, and 124 are the gate lands for the MOSFETs 36, 38. If the module 102 was split along line 118, lead land 122 would become isolated.

Figure 5:
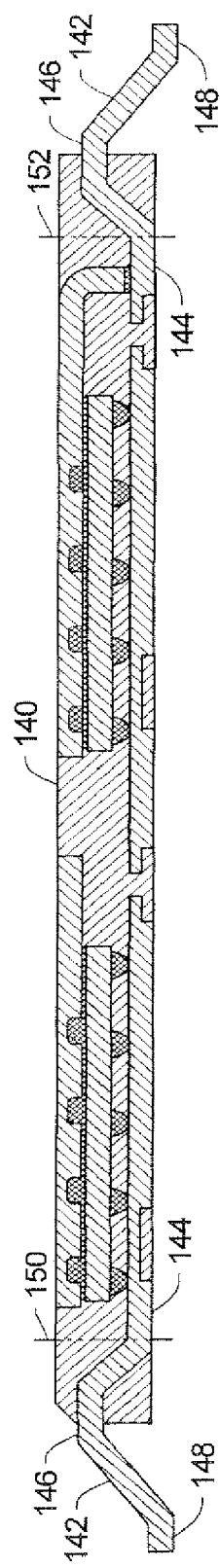
FIG. 5 is a cross section side view of a leaded dual side cooling integrated power device module according to still another embodiment of the present invention.

FIG. 5 is a cross section side view of a leaded dual side cooling integrated power device module 140 according to still another embodiment of the present invention. The module 140 has external leads 142 which are integral with the land pads 144 at the ends of the module 140. The land pads 144 are exposed at the bottom of the module 140 as in the previous embodiments, but extend out of the encapsulation by stepping upward to a first horizontal section 146 that exits the end of the module 140 above the bottom plane of the module 140, and then steps down to a second horizontal section 148 to line up approximately with the bottom plane of the module 140. This leaded module 140 can thus accommodate a leaded package footprint. The external leads 142 can be removed to form a leadless module by cutting the end portions of the module 140 at the lines 150 and 152.

Figure 6A:
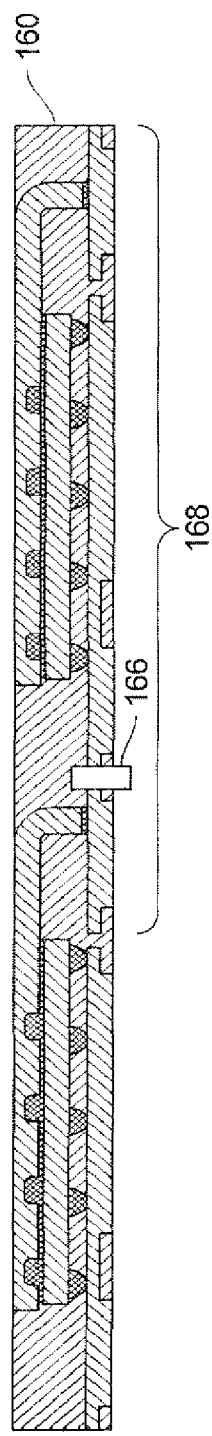
FIGS. 6A and 6B are cross section side views of modifications of the module shown in FIG. 4C to form a dual side cooling integrated power device module according to yet another embodiment of the present invention.
Figure 6B:
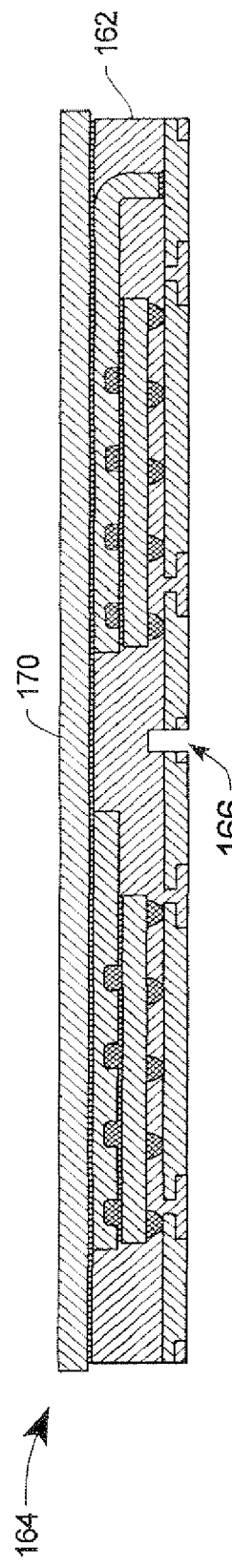

FIGS. 6A and 6B are respective cross section side views 160 and 162 of modifications of the module shown in FIG. 4C to form a dual side cooling integrated power device module 164 according to yet another embodiment of the present invention in which the drains of the two MOSFETs 36 and 38 are connected together to form a common drain. In FIG. 6A a sawn cutout 166 is made in the leadframe structure 168 to isolate the MOSFETs 36 and 38. In FIG. 6B an electrical and thermally conductive heat sink 170 is attached to the planar members 54 of the clips 44, 46 to form the common drain connection.

Figure 7A:
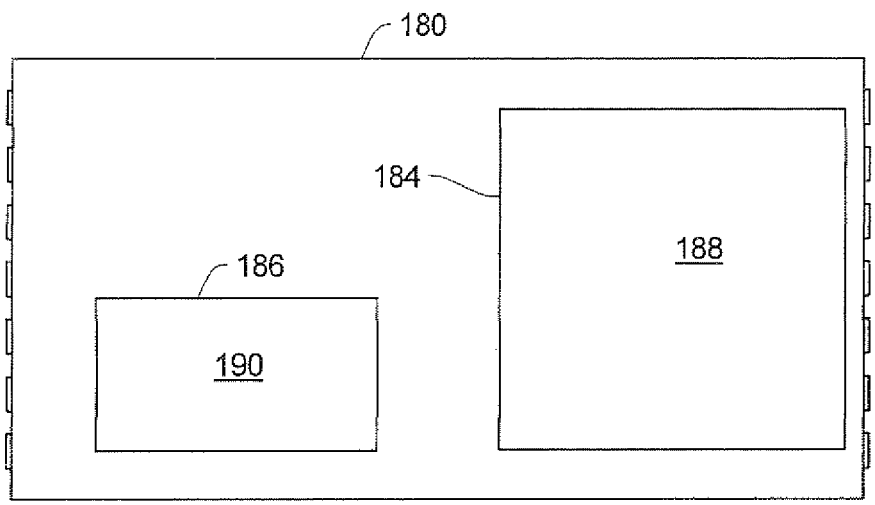
FIGS. 7A, 7B, and 7C are respective top plan, a partial cross section top plan, and bottom plan views of a dual side cooling integrated power device module according to a further another embodiment of the present invention with a control IC for driving the two power devices.
Figure 7B:
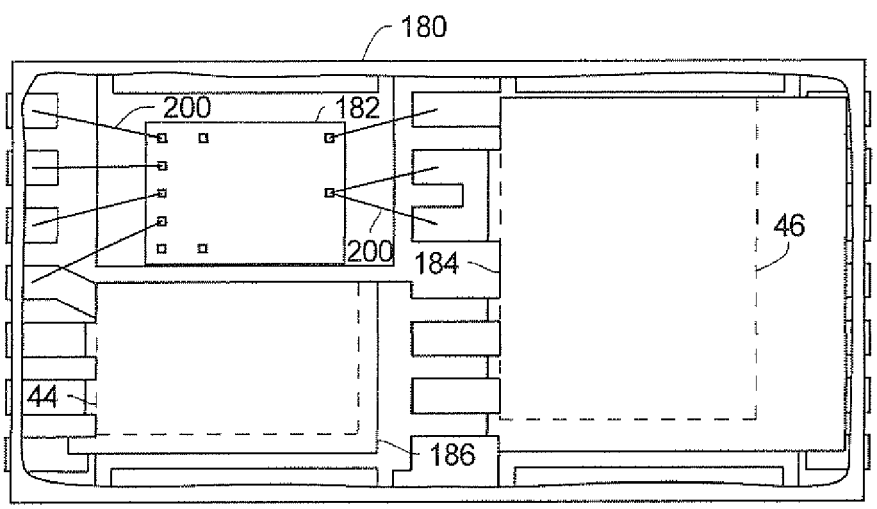
Figure 7C:
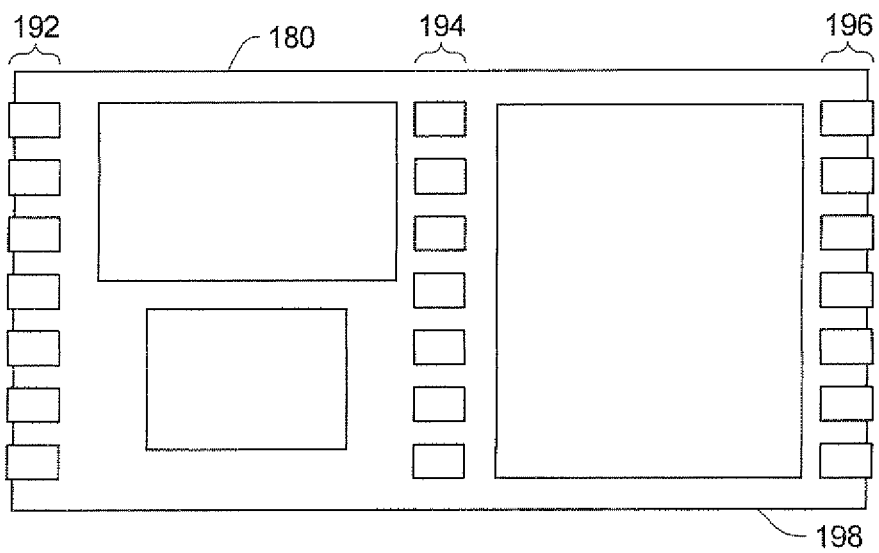

FIGS. 7A, 7B, and 7C are respective top plan, a partial cross section top plan, and bottom plan views of a dual side cooling integrated power device module 180 according to a further another embodiment of the present invention which includes a control IC 182 for driving the two MOSFETs 44, 46 which have customized clips 184 and 186, respectively, for connecting the drain of the MOSFET 44 to the source of the MOSFET 46 and for providing cooling for the MOSFETs 44, 46. FIG. 7A is the top plan view showing the respective planar members 188 and 190 of the clips 184, 186 which are exposed in the top of the module 180. As shown in FIG. 7C the module 180 has three columns of lead lands 192, 194, and 196 with the end lead lands extending past the end of the encapsulating material 198. FIG. 7B is a top plan view in partial cross section of the module 180. The control IC 182 has a plurality of wire bonds 200 to some of the lead lands in column 192 and to the gate and source of the MOSFET 46. The shape of the clips 184, 186 and the footprint of the module 180 are different than any of the previously described modules illustrating the flexibility of the present invention.

Figure 8A:
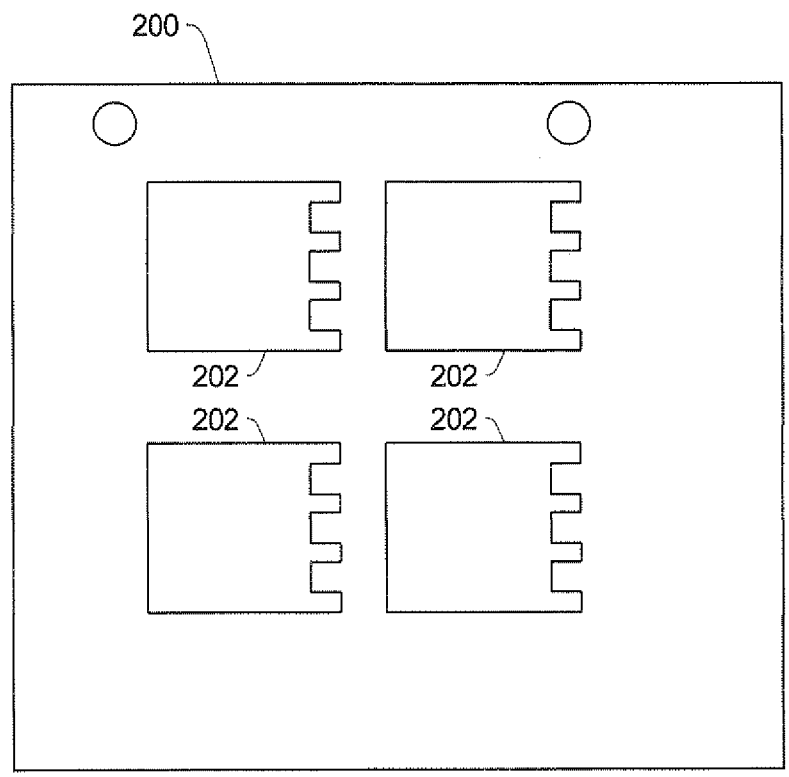
FIG. 8A is a top view of a metal plate showing the outline of four clips which are to be punched from the metal frame for use in one of the embodiments of the present invention.
Figure 8B:
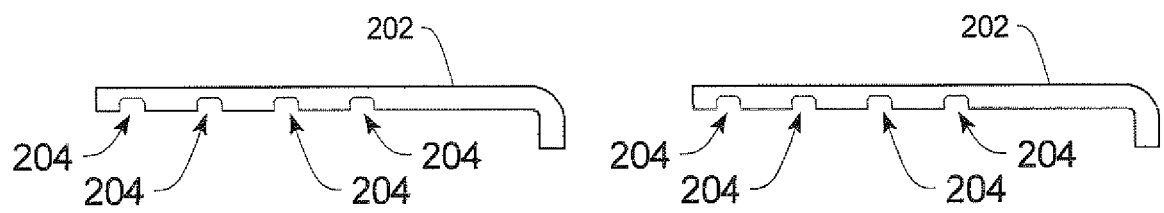
FIG. 8B are side views of two of the clips after they have been punched out of the metal plate shown in FIG. 8A and formed into the clips used in FIG. 3B.

FIG. 8A is a top view of a metal plate 200 showing the outline of four clips 202 which are to be punched from the metal frame using a well known operation for use in one of the embodiments of the present invention. Thus the clips 202 can be placed in gang and fabricated in one reel. FIG. 8B are side views of two of the clips 202 after they have been punched out of the metal plate shown in FIG. 8A and formed into the clips used in FIG. 3B. As shown in FIG. 8B, the clips 202 have grooves 204 formed in them to improve solder attachment.

Figure 9A:
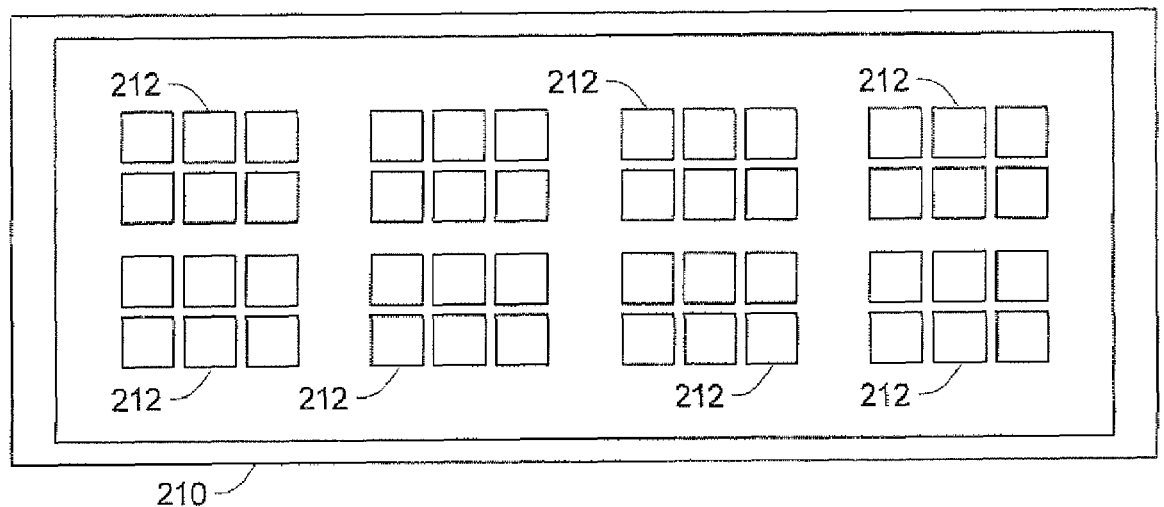
FIG. 9A is a top plan view of a block mold of a plurality of partially encapsulated modules.
Figure 9B:
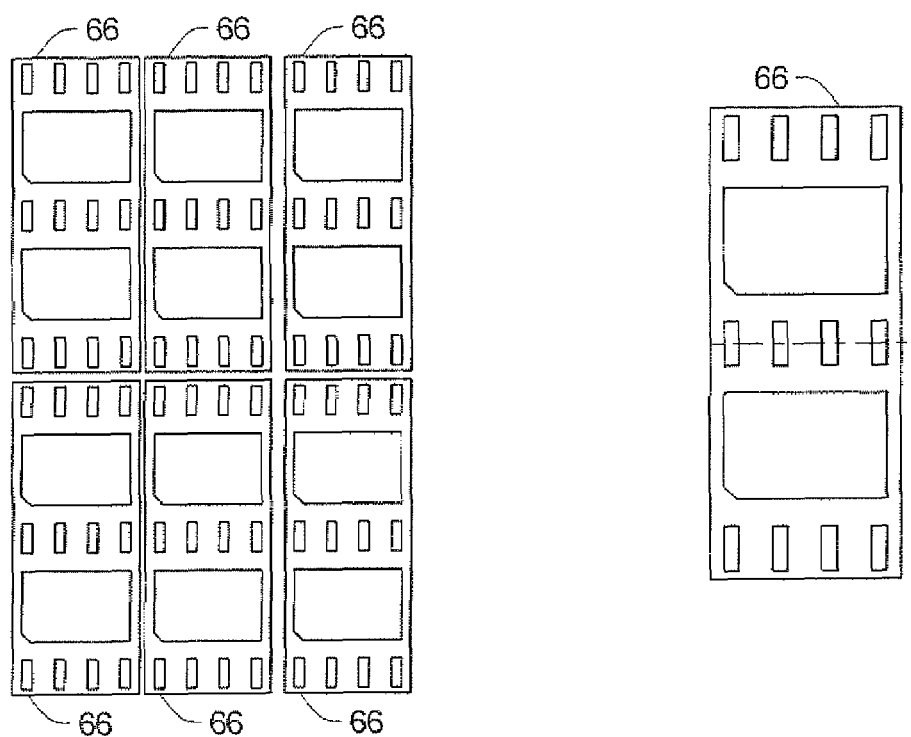
FIG. 9B is a bottom view of one type of encapsulated modules shown in FIG. 9A after they have been singulated.

FIG. 9A is a top plan view of a block mold 210 of a plurality of partially encapsulated modules 212. In the molding of the case leaded modules 140 shown in FIG. 5, the modules 140 would be formed as a singulated mold. FIG. 9B is a bottom view of the type of encapsulated modules 66 shown in FIGS. 3A-3C after they have been singulated from the block mold 210. It will be appreciated that any of the leadless modules can be formed in the block mold 210.

Figure 10:
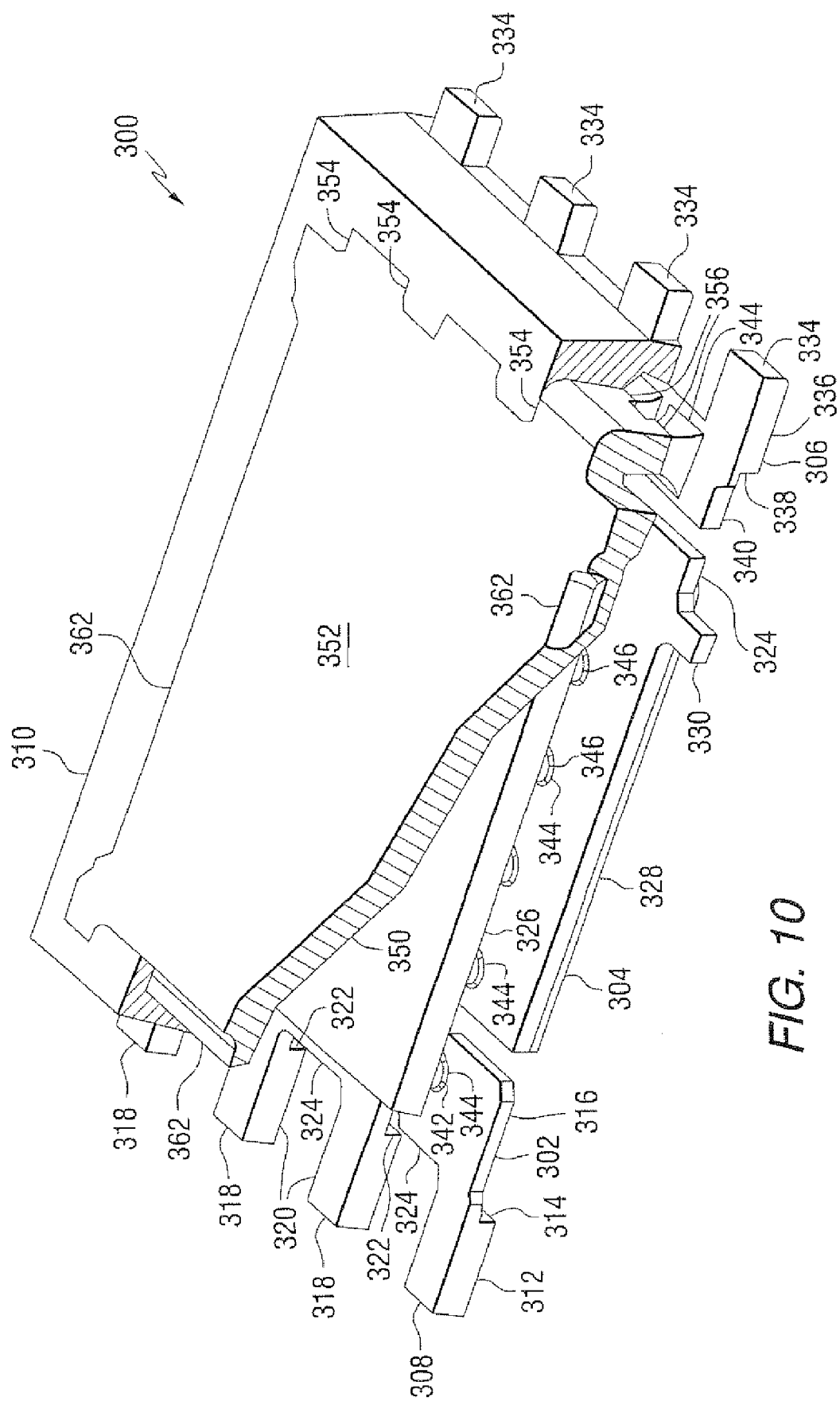
FIG. 10 is an isometric partial sectional view of a power semiconductor package according to another embodiment of the current invention.

FIG. 10 is an isometric partial sectional view of a power semiconductor package 300 according to another embodiment of the current invention. The package 300 has a leadframe structure of three separate segments, a control segment or gate segment 302, a first current carrying segment or source segment 304, and a second current carrying segment or drain segment 306. The gate segment 302 includes an external lead 308 which extends past an encapsulating material 310 and is part of a thicker portion 312 of the gate segment 302. A vertical surface 314 delineates the boundary between the thicker portion 312 and a thinner portion 316 of the gate segment 302.

The source segment 304 has three external leads 318 which extend past the encapsulating material 310 and are part of three thicker portions 320 of the source segment 304. Vertical surfaces 322 delineate the boundary between the thicker portions 320 and thinner portions 324 of the source segment 304. The thinner portion 324 is part of the main body of the source segment 304 which lies substantially below, and is attached to, a semiconductor device 326. Another thicker portion 328 extends under a portion of the main body of the source segment 304. The source segment 304 has two tie bars 330 and 332 (Shown in FIG. 11) which are used to hold the source segment in place when the semiconductor package 300 is assembled.

The drain segment 306 has four external leads 334 which extend past the encapsulating material 310 and are part of four thicker portions 336 of the drain segment 306. Vertical surfaces 338 delineate the boundary between the thicker portions 336 and thinner portions 340 of the drain segment 306.

The semiconductor device 326 is attached the gate segment 302 as well as the source segment 304. The semiconductor device may be a flip chip power MOSFET with its gate attached to the gate segment 302 by a solder bump 342 and solder 344, and with its source attached to the source segment 304 by solder bumps 346 and solder 344, not all of which are shown in FIG. 10.

Attached to the top of the semiconductor device 300 is a stud or clip 350, which may be a drain clip 350 having a top surface 352 and three bend portions 354 each of which have bifurcated ends 356. The bifurcated ends 356 are attached to the emitter segment 306 by solder 344. Each of the bifurcated ends 356 terminate in a rounded portion 360 (shown in FIGS. 11 and 15) shaped to resemble the shape of the solder bumps 342, 346 on the semiconductor device 326. The drain clip 350 is half etched to form cutout regions 362 along the middle portion on three top edges of the clip. The cutout regions 362 together with the encapsulating material 310 help to secure the drain clip 350 in place. The encapsulating material 310 extends from the top to the bottom of the package 300 while leaving exposed the top surface 352 of the drain clip 350 and the thicker portion 312 of the gate segment 302, the thicker portions 320 and 328 of the source segment 304, and the thicker portions 336 of the drain segment 306.

Figure 11:
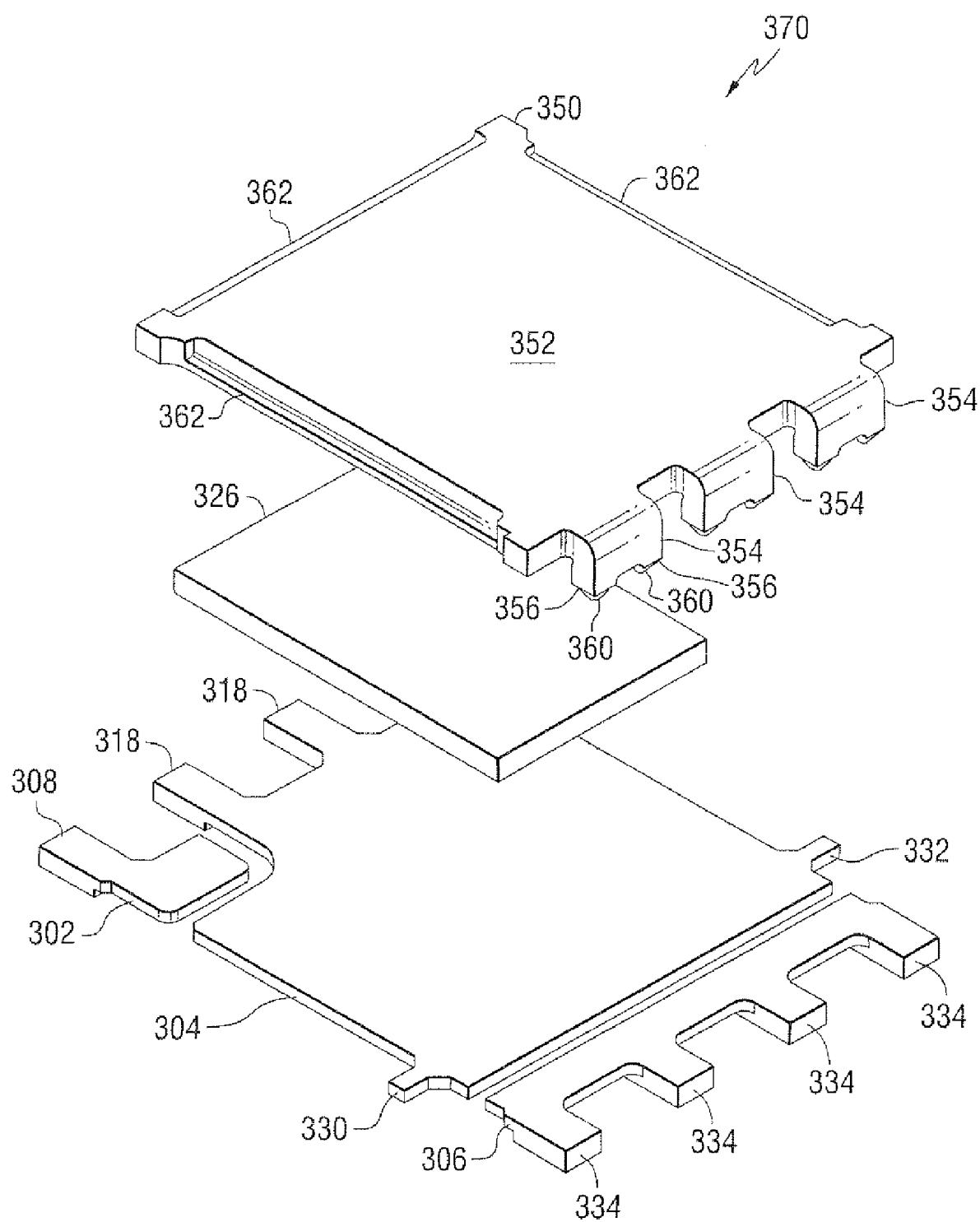
FIG. 11 is an exploded view of the power semiconductor package shown in FIG. 10 without the encapsulating material.

FIG. 11 is an exploded view of the power semiconductor package 300 shown in FIG. 10 without the encapsulating material 310 which provides a fuller view of the remaining components of the package 300.

Figure 12:
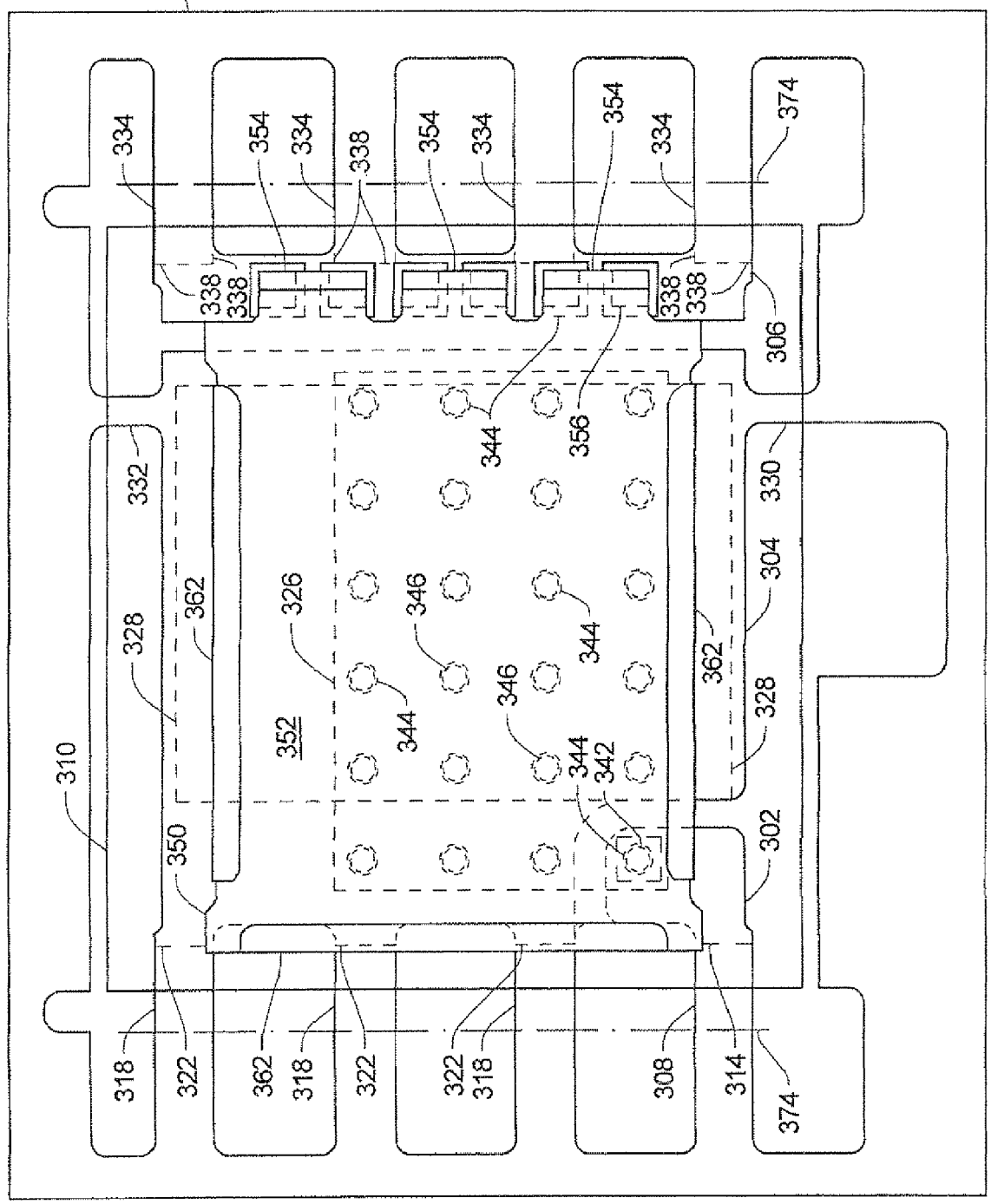
FIG. 12 is a top view with a section of the semiconductor package shown in FIG. 10 with the encapsulation shown in outline and including a leadframe prior to the singulation of the package shown in FIG. 10.

FIG. 12 is a top view 370 of the semiconductor package 300 with the encapsulation material 310 shown in outline with the leadframe structure segments 302, 304, and 306 connected to a portion 372 of a leadframe prior to the singulation of the package 300. As shown in FIG. 12 the vertical edges 338 between the thicker portion 336 and thinner portion 340 of the emitter segment 306 extends latterly in FIG. 12 as well as being parallel to the to the ends of the external leads 334. The cut lines 374 indicate the location of the ends of the external leads 308, 318, and 334 when the package 300 is singulated.

Figure 13:
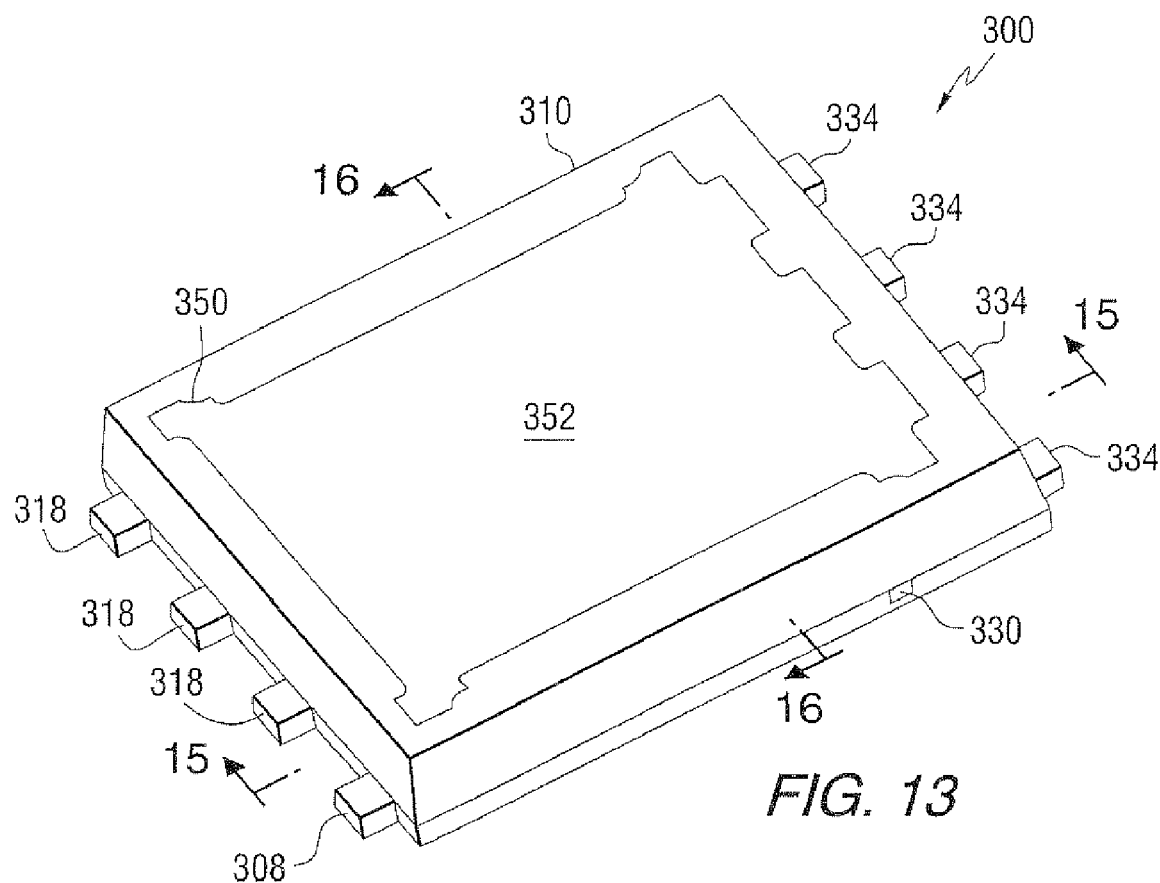
FIGS. 13 and 14 are respective isometric top and bottom views of the semiconductor package 300 shown in FIG. 10.
Figure 14:
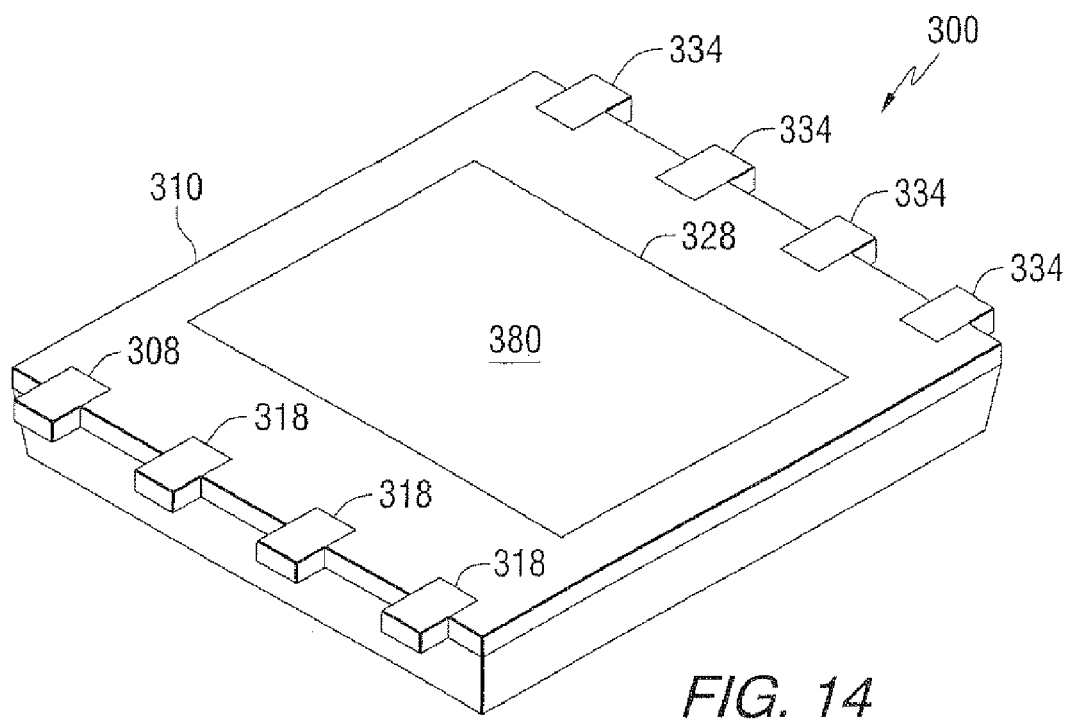

FIGS. 13 and 14 are respective isometric top and bottom views of the semiconductor package 300 shown in FIG. 10. As shown in FIG. 14, the thicker portions of the gate segment 302, the source segment 304, and the emitter segment 306 of the leadframe structure are exposed on the bottom of the package 300 while the thinner portion of the three segments 302, 304, 306 are enclosed within the encapsulating material 310. The exposed surface 380 of the thicker portion 328 of the source segment 304 is connected to the drain leads 318 and may be used instead of, or in addition to, the drain leads 318 for the electrical connection to the source of the MOSFET 326. The exposed surface 380 may also be soldered to a metal island on a printed circuit board (PCB) to provide additional heat conduction away from the semiconductor die 326.

Figure 15:
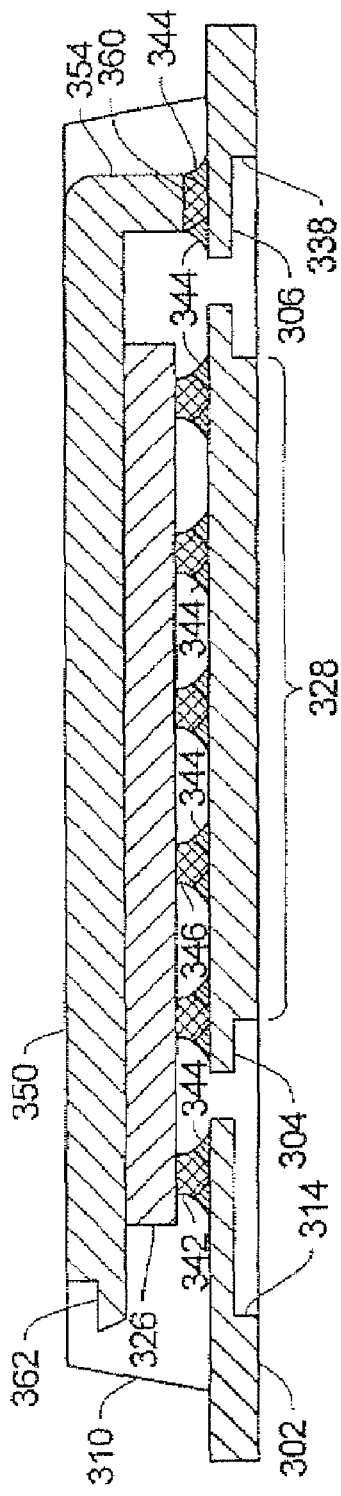
FIG. 15 is a first diagrammatical cross sectional view taken along the line 15-15 shown in FIG. 13.

FIG. 15 is a first diagrammatical cross sectional view taken along the line 15-15 shown in FIG. 13.

Figure 16:
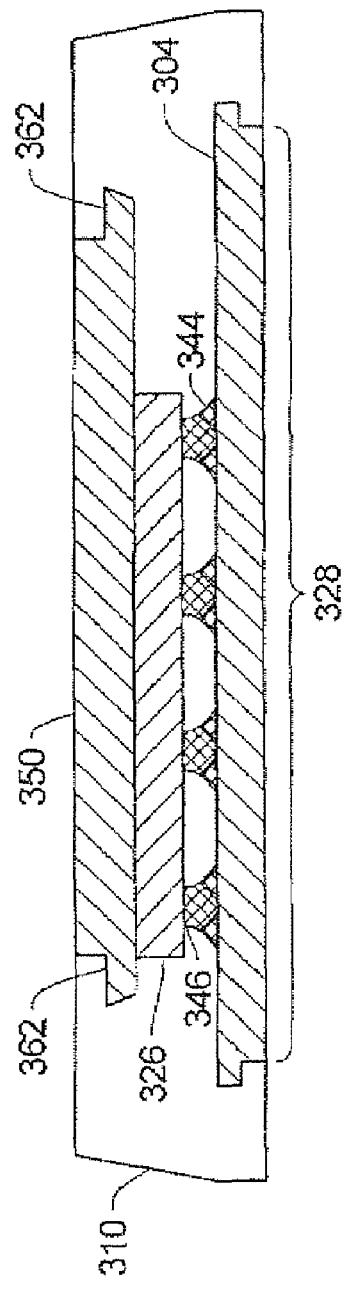
FIG. 16 is a second diagrammatical cross sectional view taken along line 16-16 in FIG. 13.

FIG. 16 is a second diagrammatical cross sectional view taken along line 16-16 in FIG. 13.

Figure 17:
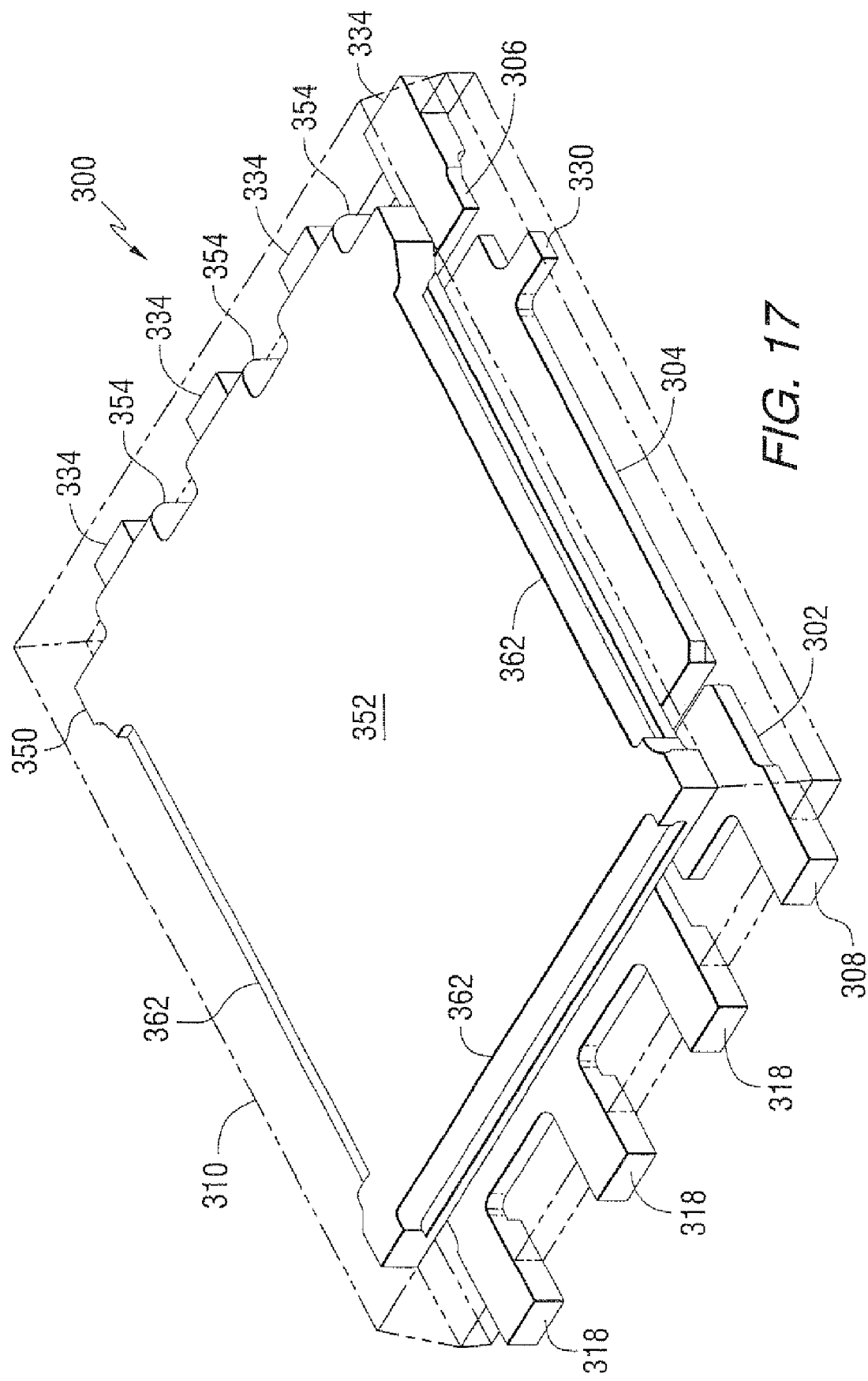
FIG. 17 is an isometric top view of the power semiconductor package shown in FIG. 10 with the encapsulating material shown in outline.
Figure 18:
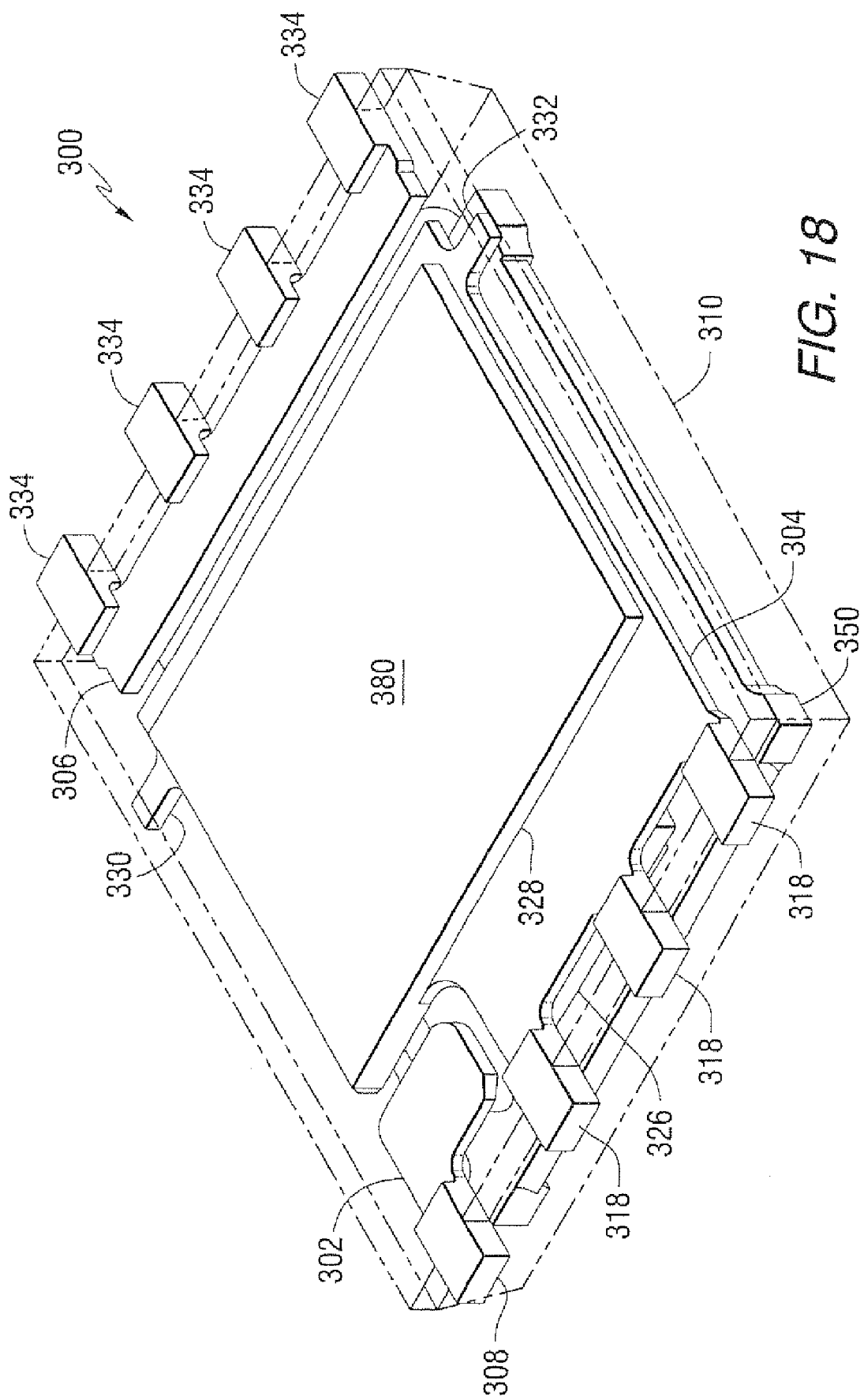
FIG. 18 is an isometric bottom view of the power semiconductor package shown in FIG. 10 with the encapsulating material shown in outline.

FIG. 17 is an isometric top view of the semiconductor package 300 shown in FIG. 10 with the encapsulating material 310 shown in outline;

FIG. 18 is an isometric bottom view of the semiconductor package 300 shown in FIG. 10 with the encapsulating material 310 shown in outline; and FIGS. 19A, 19B, 19C, 19D, 19E, 19F, 19G, 19H, 19I, 19J, 19K, and 19L are isometric views of the semiconductor package 300 shown in FIG. 10 at various stages in the assemble of the package 300. FIG. 19A shows the bottom of the clip 350.

It will be understood that although only a single clip 350 is shown, the clip 350 is attached to other clips 350 during this portion of the assembly process. The semiconductor die 326 is soldered on its back side to the clip 350 by placing soft solder onto the clip 350, placing the semiconductor die 326 in place on the soft solder, and reflowing the solder to form a solder bond 400 between the semiconductor die 326 to the clip 350.

Next copper bumps or wafer level ball drops are placed one the top side of the semiconductor die to form the solder bumps 342 and 246 as shown in FIG. 19C. In FIG. 19D the clip 510 is separated or singulated from the other clips attached to it.

FIG. 19E shows the portion 372 of a leadframe shown in FIG. 12 after solder paste 402 has been placed on the portion 372. The assembly shown in FIG. 19D is placed over the portion 372 and soldered to the portion 372 by reflowing the solder paste to form the assembly shown in FIG. 19F. The heat required to reflow the solder paste is less than the heat required to soften the soft solder put on the clip 350 in FIG. 19B, and therefore the bond between the clip 350 and the semiconductor die 326 is not disturbed.

Next the encapsulating material 510 is molded onto the assembly shown in FIG. 19 using film assist molding as shown in FIG. 19G. The assembly is then subjected to wafer jet deflash (FIG. 19H) and laser marking (FIG. 19I).

The package 300 is then singulated from the leadframe to form the assembly shown in FIG. 19J. The assembly is then tested (FIG. 19K) and packed and shipped (FIG. 19L).

The invention has been described in detail with particular reference to certain preferred embodiments thereof, but it will be understood that variations and modifications can be effected within the spirit and scope of the invention.

The invention claimed is:

1. A partially encapsulated semiconductor package having a top clip with an exposed top surface and a plurality of folded bent portions which are substantially perpendicular to said exposed top surface of said thermal clip, and a leadframe structure having separate segments wherein all of said plurality of folded bent portions are in contact with only one of said segments.

2. The package of claim 1 wherein said top clip has one or more cutouts on one or more top side edges which are filed in with encapsulating material.

3. The package of claim 1 further including a semiconductor device attached to said clip and to said leadframe structure.

4. A method of making a partially encapsulated semiconductor package comprising the steps of:
   providing a coplanar leadframe structure having a control segment, a first high current segment and a second high current segment to form three separate segments;
   attaching a semiconductor device to said control segment and said first current segment;
   attaching a clip to a side of said semiconductor device opposite said leadframe structure, said clip having a plurality of bent portions attached to said second high current segment; and
   partially encapsulating said leadframe structure, said semiconductor device, and said clip with molding material to form said package.

5. The method set forth in claim 4 wherein each of said three segments are formed with a thicker portion and a thinner portion.

6. The method set forth in claim 4 wherein each of said bent portions of said clip have bifurcated ends.

7. The method set forth in claim 6 wherein each of said bifurcated ends terminate in a rounded portion.

8. The method set forth in claim 4 wherein said clip is half etched.

9. The method set forth in claim 4 wherein said clip is formed with cutout portions.

10. The method set forth in claim 9 wherein said encapsulation material fills said cutout portions.

11. The method set forth in claim 4 said encapsulation material does not cover a top surface of said clip.

12. The method set forth in claim 5 wherein said encapsulation material does not cover a bottom surface of said thicker portions of said three segments.

13. A partially encapsulated semiconductor package comprising:
   a coplanar leadframe structure having a control segment, a first high current segment and a second high current segment;
   a semiconductor device attached to said control segment and said first current segment;
   a half etched clip attached to a side of said semiconductor device opposite said leadframe structure, said clip having a plurality of bent portions attached to said second high current segment; and
   encapsulating material that partially encapsulates said leadframe structure, said semiconductor device, and said clip with molding material to form said package.

14. The partially encapsulated semiconductor package set forth in claim 13 wherein said control segment, said first high current segment, and said second high current segment are formed with a thicker portion and a thinner portion.

15. The partially encapsulated semiconductor package set forth in claim 13 wherein each of said bent portions of said half etched clip have bifurcated ends.

16. The partially encapsulated semiconductor package set forth in claim 15 wherein each of said bifurcated ends terminate in a rounded portion.

17. The partially encapsulated semiconductor package set forth in claim 13 wherein said half etched clip is formed with cutout portions.

18. The partially encapsulated semiconductor package set forth in claim 17 wherein said encapsulation material fills said cutout portions.

19. The partially encapsulated semiconductor package set forth in claim 13 said encapsulation material does not cover a top surface of said half etched clip.

20. The partially encapsulated semiconductor package set forth in claim 14 wherein said encapsulation material does not cover a bottom surface of said thicker portions of said three segments.

* * * * *